United States Patent [19]

Bock et al.

[11] Patent Number: 5,155,856
[45] Date of Patent: Oct. 13, 1992

[54] ARRANGEMENT IN A SELF-GUARDING DATA PROCESSING SYSTEM FOR SYSTEM INITIALIZATION AND RESET

[75] Inventors: Dietrich W. Bock; Peter Mannherz; Peter Rudolph, all of Schoenaich; Hermann Schulze-Schölling, Gaertringen, all of Fed. Rep. of Germany

[73] Assignee: International Business Machines Corporation, Armonk, N.Y.

[21] Appl. No.: 401,332

[22] Filed: Aug. 31, 1989

[51] Int. Cl.⁵ .................................... G06F 13/00
[52] U.S. Cl. .................................... 395/800; 395/550; 395/575; 364/DIG. 1; 364/259; 364/259.9; 364/280.2; 364/270; 364/244.5
[58] Field of Search ... 364/200 MS File, 900 MS File; 395/550, 800, 425, 250, 575

[56] References Cited

U.S. PATENT DOCUMENTS

| | | | |
|---|---|---|---|
| 4,298,980 | 11/1981 | Hajdu et al. | 371/22.3 |
| 4,423,509 | 12/1983 | Feissel | 371/22.3 |
| 4,503,386 | 3/1985 | DasGupta et al. | 371/22.3 |
| 4,625,312 | 11/1986 | Bashaw | 371/16 |
| 4,752,907 | 6/1988 | Si et al. | 371/22.3 |
| 4,843,539 | 6/1989 | Bury | 395/250 |
| 4,958,274 | 9/1990 | Dutton et al. | 364/200 |

FOREIGN PATENT DOCUMENTS 59-20025 2/1984 Japan.

OTHER PUBLICATIONS

"Hardware Reset of LSSD Logic Chip During System Operation (Fixed Reset)", IBM Technical Disclosure Bulletin, vol. 28, No. 6, Nov. 1985, p. 2635.
"A Logic Design Structure for LSI Testability" by E. B. Eichelberger, Proceedings of the Design Automation Conference, No. 14, 20-22, Jun. 1977, New Orleans, La., pp. 462-468.

Primary Examiner—Lawrence E. Anderson
Assistant Examiner—Mehnet Geckil
Attorney, Agent, or Firm—Stephen J. Limanek; Mark F. Chadurjian

[57] ABSTRACT

In computer systems deliberate initializations/resets of the processor latches which represent the internal processor states are necessary to erase only such information which is not required for a subsequent operation, e.g., processing/logging error data, prior to a processor start. One or more reset areas are defined which are initialized/reset in a staggered mode, where in each area a group of latches is assembled which have to be initialized/reset depending on the cause, e.g., power-on, for such a system initialization/reset. The latches within a reset area are connected to form shift registers which are initialized/reset by propagating a binary zero through all latches of the area(s) to be reset.

15 Claims, 5 Drawing Sheets

ARRANGEMENT IN A SELF-GUARDING DATA PROCESSING SYSTEM FOR SYSTEM INITIALIZATION AND RESET

1. Technical Field

This invention relates to an arrangement in a self-guarding data processing system for system initialization and reset.

2. Background Art

In data processing systems deliberate system initializations and resets are necessary to erase or clear only such information which is not required for a subsequent operation, e.g., for logging or processing error data, for error correction, for repeating an interrupted operation in case of an intermittent error, or for maintenance.

In current data processing systems with dedicated service processors, system initializations and resets can be performed in partial areas of the central processing unit (CPU), depending upon a specific machine situation, e.g., power on, failure and loading, by micro programs resident in a dedicated service processor via a respective service interface.

As already mentioned above, these selective and machine situation dependent initializations/resets are necessary to clear or erase only such information which is not required for a subsequent operation or which has to be in a known and defined initial state as a base for further processing.

In data processing systems without a dedicated service processor and systems, other than low cost systems where system initialization and reset is made by switching off and on the main switch, and causing a general reset, special measures have to be taken.

DISCLOSURE OF THE INVENTION

It is, therefore, an object of this invention to present a solution for selective, situation dependent, system initialization and reset actions within a data processing system.

Accordingly, an arrangement in a self-guarding data processing system is disclosed for system initialization and reset by setting the processor latches which represent the internal processor states to an initial state, "1" or "0", which is characterized by a staggered initialization or resetting or the processor latches, SRL1 . . . SRLv, arranged in reset areas, which may be identified as S, I and F, where in each area a group of latches is assembled which have to be initialized/reset prior to a system restart, depending on the cause, e.g., power-on, for such a system initialization or reset, the reset areas being series connected.

The above described features result in the advantage of an effective handling of system initialization and reset in an electronic data processing system.

The foregoing and other objects, features and advantages of the invention will be apparent from the following more particular description of the preferred embodiments of the invention as illustrated in the acompanying drawings.

BEST MODE FOR CARRYING OUT THE INVENTION

Figure 1:
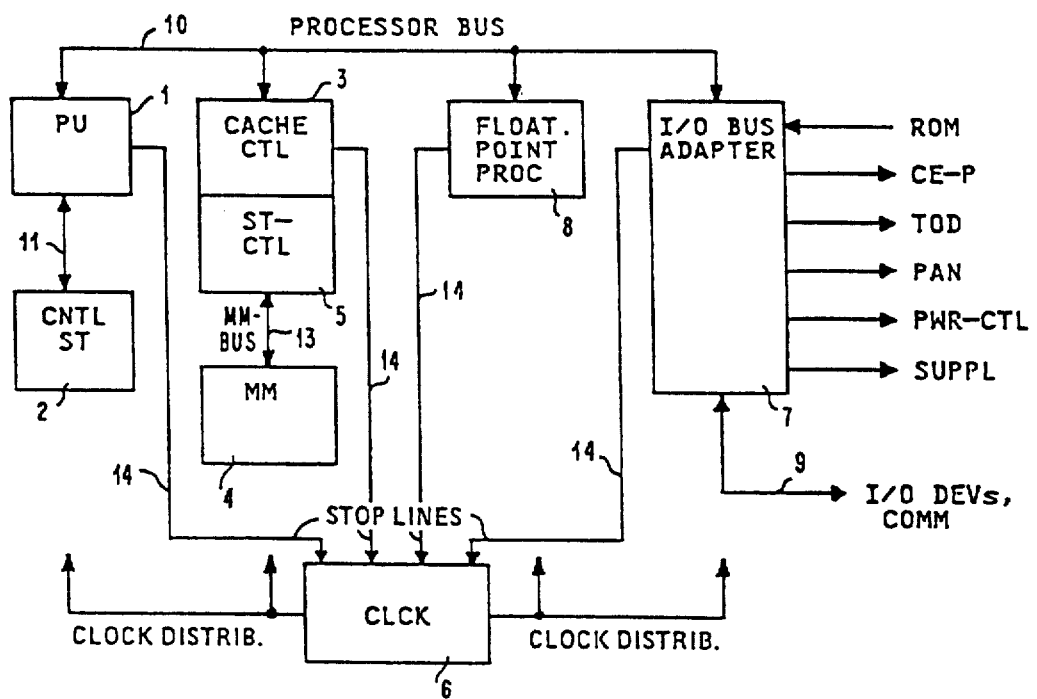
FIG. 1 is a schematic block diagram showing the general structure of a data processing system which forms the environment of the invention.

Referring now to FIG. 1, there is a block diagram of a conventional data processing system having various complex components which are interconnected by buses. As the figure shows, there is no dedicated service processor which can support a processing unit (PU) 1 for handling power on sequences, program loading, or error logging, analysis and recovery. A processor bus 10 connects the central control component, the processing unit 1, to a main memory (MM) 4 via a cache/main storage controller (cache CTL/ST-CTL) 3 and 5 and a main memory bus (MM-bus) 13. Processor bus 10 also connects the processor 1 to an optional floating point processor 8 and at least to one input/output (I/O) bus adapter 7. The I/O bus adapter 7 connects processor bus 10 via an input/output bus (I/O bus) 9 to various Input/Output devices (I/O DEVs), and to further components such as communication adapters (COMM), etc. I/O bus adapter 7 is further designed to connect various control and monitoring components to the system, such as a customer engineering panel, CE-P, a battery operated time of day clock, TOD, a read only memory unit, ROM, an operator panel, PAN, a power controller, PWR-CTL, or two supplementary devices, SUPPL. A control store (CNTL-ST) 2 containing the control program is connected to the PU 1 via a separate control store bus 11.

The system clock generation and distribution is centralized on a clock chip (CLCK) 6 which has multi-wire connections 14 to almost all of the system components. As an example, in the following description three initialization/reset areas are defined for processing unit 1. However, any other reasonable number of reset areas can be used. In the following reset concept which assumes three ranges of chained shift register latches (storage elements) which are used for implementing the system design in accordance with the level sensitive scan design rules (LSSD rules), the shift register latches are reset by flashing or ripple. The level sensitive scan design rules are described in the article, "A logic design structure for LSI testability" by E.B. Aichelberger, Proceedings of the Design Automation Conference No. 14, Jun. 20–22, 1977, New Orleans, Louisiana, pp. 462–468.

The three reset areas are defined below:

The S-area (power-on reset area) includes all shift register latches (SRL) of the system, with the exception of those which are used to form storage arrays.

The I-area (system reset area) includes all SRLs which are used as indication latches (check indicators). Latches, however, which are part of maintenance and/or service circuitry are not included. As an example, a microinstruction address compare register and the respective stop circuits of the PU chip 1 will not be reset. This offers the opportunity of checking and examining the system reset functions under conditions which are set into those registers.

The following listed functions which are manually invoked by the user force a system reset operation:

Initial Micro Code Loading (IML), system Reset (with/without clearing the memory) and Loading Off the system program (with/without clearing the memory, IPL).

The F-area assembles the function latches (check reset area). This area only includes the SRLs of the PU which have to be reset into an error free state prior to restarting the PU for executing an error handling microprogram.

In order to avoid an uncontrolled processing or unscheduled behavior of a PU, self-guarding actions based on check information contained in check circuits or checkers are never suppressed (no check stop override), which is the principle of an "always hot checkers" philosophy. By a selective reset of processor elements required for a new start of special microprograms, the error indicators and error stati which form "error images" survive the reset operation and can be accessed and processed by subsequent microprograms which are also guarded by the checking means.

Figure 3:
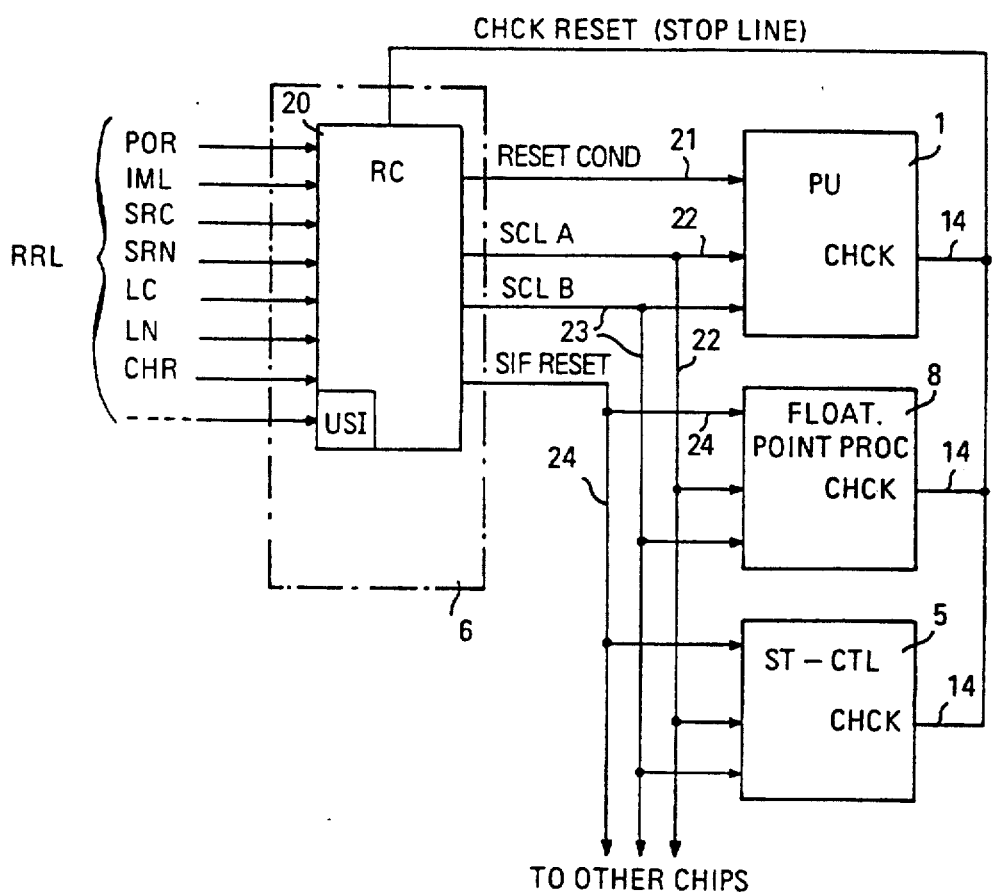
FIGS. 3 and 4 are block diagrams showing the circuitry necessary for system initialization and reset according to the invention.

The reset control (RC) 20 as shown in FIG. 3 is located on clock chip 6. Connected to the reset control 20 are all the reset request lines RRL, on which the signals can cause a total or partial system initialization or reset. The signals from top to bottom on the left side of FIG. 3 are the "power on reset" signal POR, the "initial micro program load" signal IML, the "system reset clear" signal SRC, the "system reset normal" signal SRN, the "load clear" signal LC and the "load normal" signal LN. These signals will be explained with more detail later on.

Figure 2:
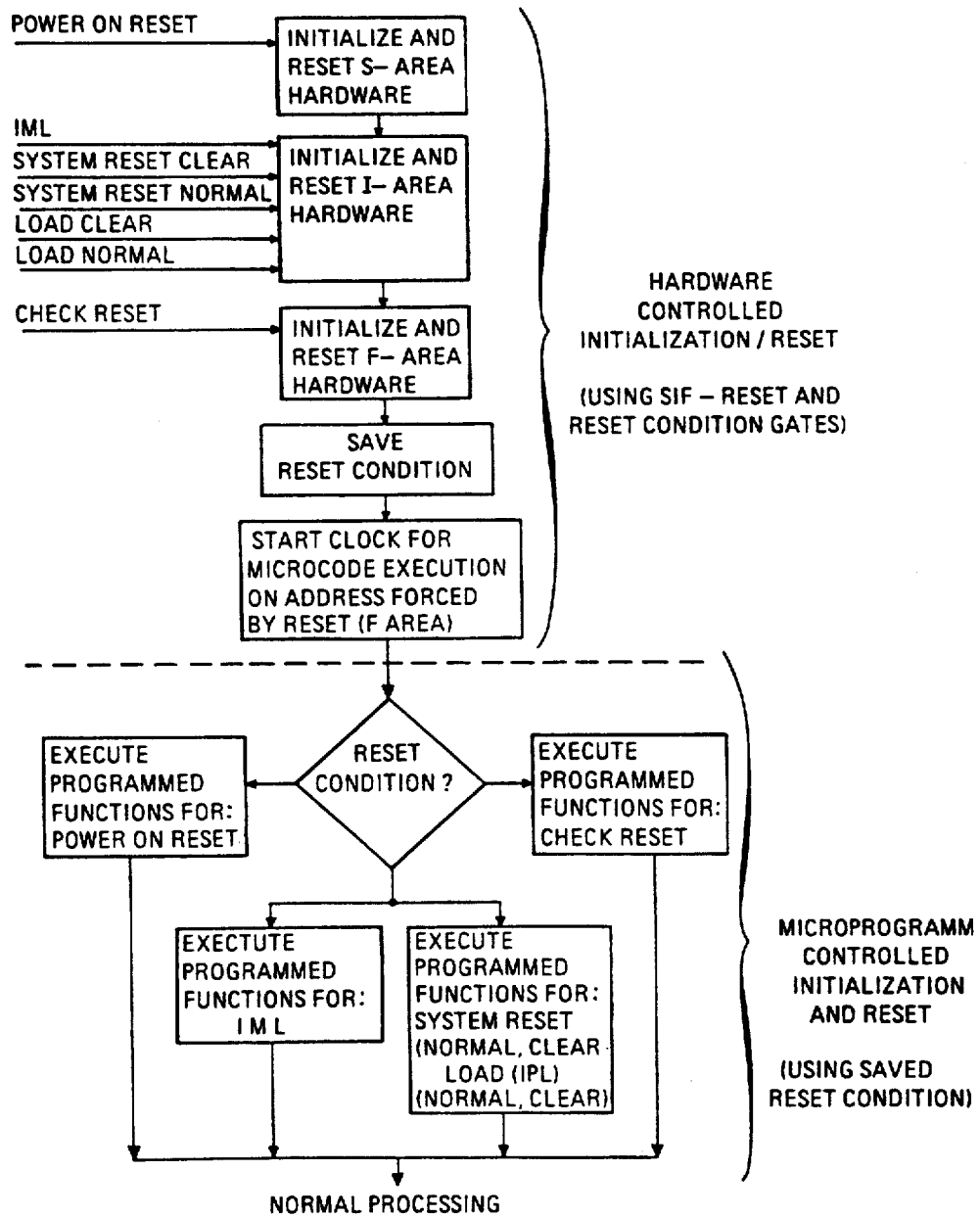
FIG. 2 is a block diagram of the reset structure.

The reset operations as shown in FIG. 2 are system specific and based on hardware design and architectural requirements.

These reset operations can be arranged in a sequence according to the depth of their clearing effects on the hardware and logic areas within a data processing system. The most significant clearing action, power-on reset, can be considered as a general action supported by a sequence of single reset actions. The other reset actions involve less portions of the logic amount which means that more information is left in its original state.

The system reset clear signal SRC, the system reset normal signal SRN, the load clear signal LC and the load normal signal LN result in a reset of the latches of the I- and F-areas.

A check reset CHR causes a reset of the latches of the F-area.

The given reset functions can alternatively be activated via a unti support interface (USI) for remote control purposes The reset control (RC) 20 has a set of output lines 21 to 24 for the transfer of various control signals to processor chip 1, floating point processor 8, storage controller 5 and to other chips which might be included in a computer system, an example of which is shown in FIG. 1.

Output line 21 is used to transfer the reset condition information, three bits in parallel, to the processor chip 1. Output lines 22 and 23 distribute the common clock signals, shift clock A (SCL A) and the shift clock B (SCL B), to the various chips. While shift clock A controls the master latches, shift clock B controls the slave latches of the chained shift register latches SRL.

The reset areas are further controlled by a two-wire line 24 which connects reset control 20 to the various chips with the exception of processor chip 1. The four different states of these two lines are sufficient to select the three given reset areas (S-, I-, F-; I-F; and F- only) and to indicate a "no-reset" state. Output line 21 consists of three wires thus being able to express 8 different states. These are the 7 different reset causes and one "no-reset" state. The 7 reset states are used in a twofold manner: 1) They designate the three reset areas and in addition to the two wire output line 24, they 2) provide the reset causes in detail. The reset causes are manifested in the so called reset indicator latches which can only be sensed (read) and reset by microinstructions of the error handling routines. The information which is stored in all those reset indicator latches allows a detailed analysis of the reason or cause of a system reset and can be used later on for controlling the microprogram after restarting the computer system.

Output line 21 extends only to that chip which provides the logic required to access the reset information by microinstruction, which is the processing unit PU chip in this specific case.

Reset control 20 within clock chip 6 is further controlled by check reset signals which are activated by erroneous chips. The check reset signals are transmitted via so called stop lines 14 which are explained with more detail in European Patent Application 88 108 138.4.

TABLE

| KEY or SIGNAL | RESET COND. BIT: 0 1 2 | SIF RESET BIT: 0 1 | RESET AREA |
|---|---|---|---|
| Power on Reset | 1 1 1 | 1 1 | S, I, F |
| IML | 1 1 0 | 1 0 | I, F |
| System Reset Clear | 1 0 1 | 1 0 | I, F |
| System Reset Normal | 1 0 0 | 1 0 | I, F |
| Load Clear | 0 1 1 | 1 0 | I, F |
| Load Normal | 0 1 0 | 1 0 | I, F |
| Check Reset | 0 0 1 | 0 1 | F |
| NO Reset | 0 0 0 | 0 0 | — |

The above table gives a survey with regard to the bit combinations forming the three-bit reset condition code which is transferred on line 21, the bit combinations of the two-bit area reset code transmitted on line 24, and the areas which are reset depending on the various input signals to reset control 20 fed on the reset request lines RRL.

Figure 4:
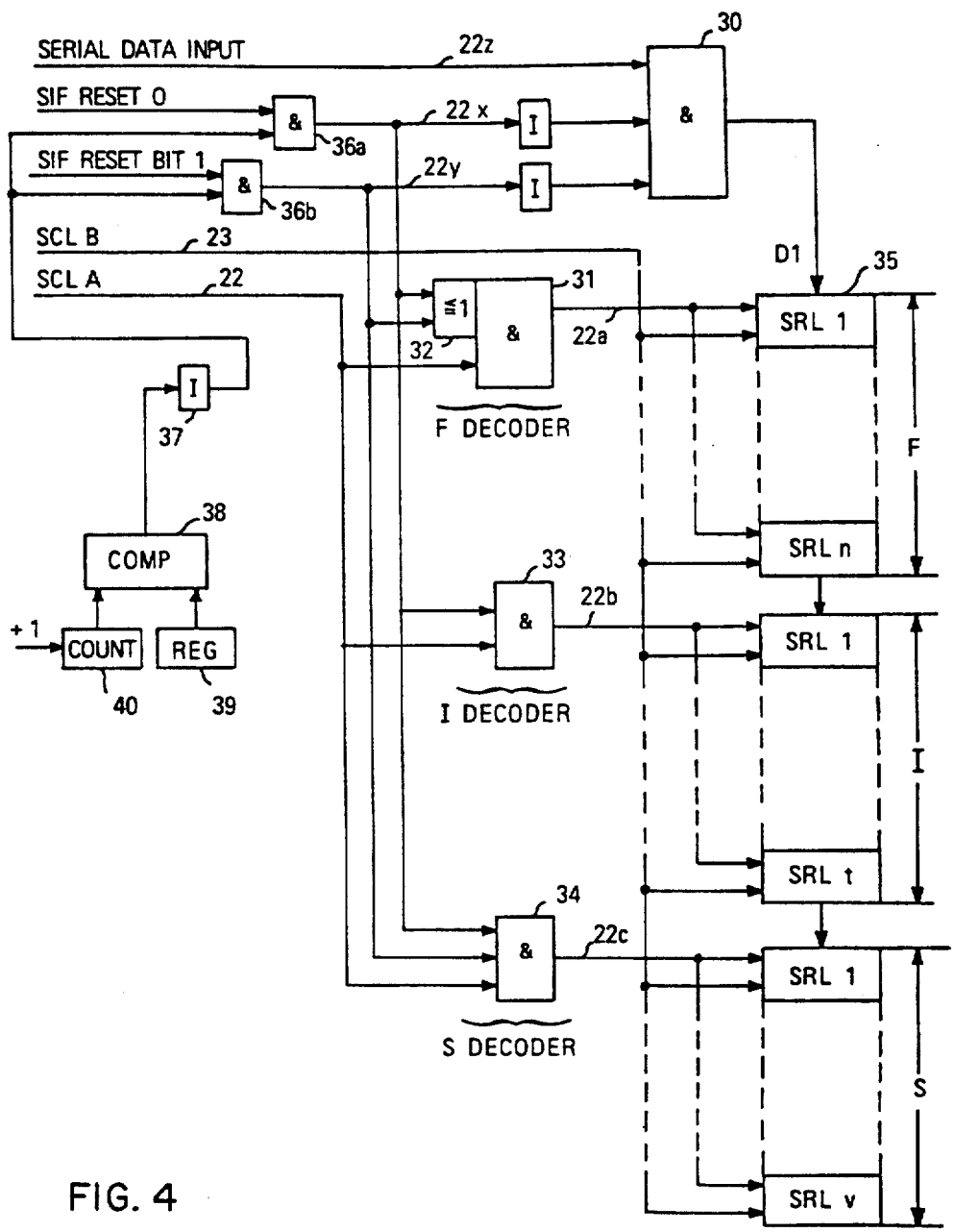

As shown in FIG. 4, the direct decoding of the signals on line 24 is used at the receiving side to connect the shift clock A (SCL A) to the master latches of the shift register latches SRL1 ... SRLn, SRL1 ... SRLt, SRL1 ... SRLv of the respective reset area F, I, S. Shift clock B (SCL B) is permanently connected to the slave latches of the shift register latches. The decoding of the SIF reset bits on line 24 is performed by the AND gates 31, 33 and 34 and OR gate 32. When, for example, only reset area F has to be reset, the SIF reset bit combination "01" has to be applied to line 24. The inverted bit combination on line 24 is also fed to AND gate 30, together with a serial data input. The output signal of AND gate 30 is, in any case a binary zero, with the exception of a code combination "00" which represents, however, a no reset condition, as can be seen in the table. With a binary zero at the input of SRL chain 35 and the pulses of shift clocks A and B, the binary zero is propagated through all stages of reset area F of shift register chain 35, thereby resetting all stages to zero.

A propagation beyond the F-area is not possible at this time, because the coincidence condition for only AND gate 31 is met, and so shift clock SCL A is transferred to only the master latches of the F area via line 22a.

When rest areas F and I are to be reset, e.g., in case of "load normal" (SIF reset code "10"), AND gate 33 will additionally be enabled so that the pulses of shift clock A will be transferred via line 22b to the master latches of the I-area. The binary zero already propagated through the F-area, continues through the I-area latches.

For "power-on reset" (SIF reset code "11") all three AND gates 31, 33 and 34 are activated so that shift clock A pulses will be gated via lines 22a, 22b and 22c to all master latches of shift register chain 35.

Now the binary zero propagates through the register chain until its end at latch SRL v.

Figure 5:
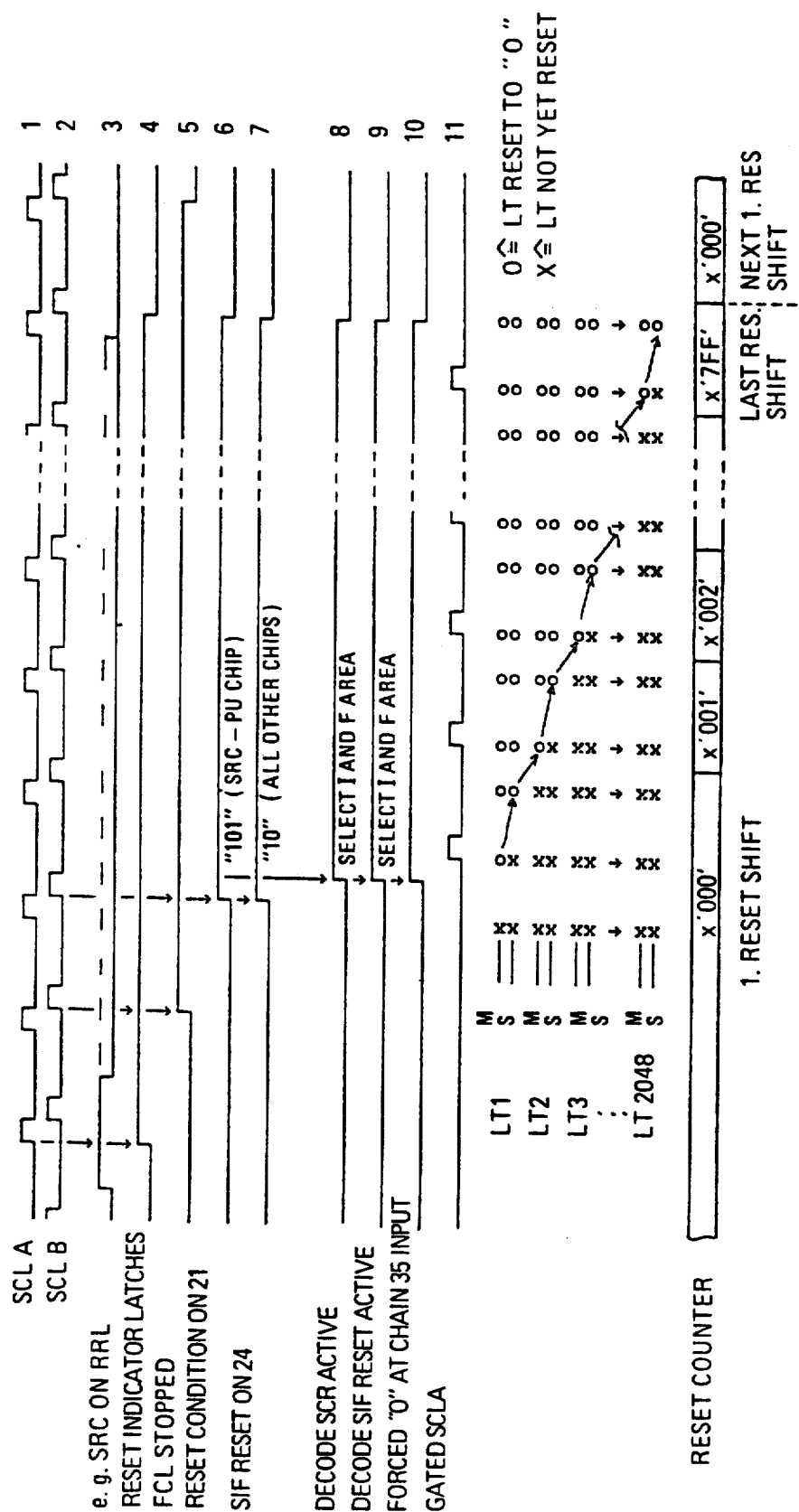
FIG. 5 is a pulse diagram of signals controlling the arrangements of FIGS. 3 and 4 for performing system initialization and reset.

The pulse diagram and the scheme of resetting the latches of shift register chain 35 which are represented in FIG. 5 show with more detail how the system is operated. The first two lines, lines 1 and 2, on top of FIG. 5 show the pulses of the shift clock SCL A applied to the master latches, and of shift clock SCL B for the slave latches of the shift register latches in shift register chain 35.

Line 3 shows a situation where a reset request, e.g., "system reset clear" (SRC) came in on line RRL. With the leading edge of the next shift clock SCL A, the reset indicator latches are turned on, as indicated in line 4. The functional clocks FCL which are also applied to the shift register latches and which are not shown will be stopped with the leading edge of the next shift clock SCL B (line 5).

The reset condition code on line 21 and the SIF reset code on line 24 will be available with the leading edge of the next shift clock SCL B (lines 6 and 7). After a natural delay caused by circuit delays, the select signals for reset areas I and F are available, as shown in lines 8 and 9 of FIG. 5 as well as the forced zero at the input of shift register chain 35 (line 10).

Line 11 shows the pulses of gated shift clock SCL A which is available on lines 22a and 22b.

The lower part of FIG. 5 shows the zero propagation through latches LT1 to LT2048 which form the shift register chain in this example. In each shift register stage the zero is transferred from its master latch M to its slave latch S. At the end of the propagation all latches or stages are reset to zero.

The maximum length of a reset chain in a given system determines the maximum count of counter 40 which is located in reset control 20. The counter is incremented in a close relationship to the shift clock pulses, and its count is transferred to a comparator 38. Register 39 is used to store a value which is equal to a preferred or selected number of shift register stages forming a chain, in the present example equal to the number 2048. Comparator 38 detects the situation when the actual count in counter 40 equals the preferred maximum length of the chain, the value of which is stored in register 39. In this case the output signal of comparator 38, including an inverter 37, changes from binary one to zero so that transmission gates 36a and 36b no longer transfer the SIF decode on lines 24x and 24y (decode 0=no reset). This terminates the zero propagation.

If the maximum count would be smaller than the number of latches in the chain, the binary zero propagation would stop before reaching the end of the chain, leaving some latches in an undefined state. Larger counts have no harmful influence because the zero propagation stops at the end of the chain.

Depending on the logic design of the processor circuitry, the reset state for a certain individual latch within the chain may assume the opposite form, which means a binary one. Those specific individual latches need an inverter stage at their input and their output (double inversion). Another more economic solution simply uses the "not Q" output of the preceding latch and of the individual latch when the following shift register stage requires a zero state.

As further shown in FIG. 4, AND gate 30 generates the binary zero for propagation. Whenever the bits of the SIF reset code on line 24 differ from zero, a binary zero is forced at the input D1 of chain 35 independent of what level is provided on the Serial Data Input line 22z which, in a non-reset state, provides the serial input data to the chain input D1.

While the invention has been particularly shown and described with reference to preferred embodiments thereof, it will be understood by those skilled in the art that various changes in form and details may be therein without departing from the spirit and scope of the invention.

What is claimed is:

1. An arrangement in a self-guarding data processing system for initialization and reset of said system, said system comprising a serially-arranged plurality of sets of latches, the latches of each set being serially arranged, each of said sets having an input and an output with at least an output of one of said sets of latches being connected to an input of another of said sets of latches and each of the latches of each of said sets of latches having a defined reset state, and control means including a plurality of parallelly-arranged decoders, each of said decoders having a plurality of inputs and an output, the output of each of said decoders being coupled to a respective one of said plurality of sets of latches for selectively setting each of the latches of at least one of said sets of latches in the reset state, said control means further including reset control means having reset request input lines and output lines, said output lines being coupled to the inputs of said parallelly-arranged decoders and clock means generating first and second clock pulses, said first clock pulses being applied to said latches selectively through said parallelly-arranged decoders and said second clock pulses being applied to each set of said serially-arranged plurality of sets of latches.

2. An arrangement as set forth in claim 1 wherein each of said sets of latches includes latches serially arranged from a first latch to a last latch and wherein said control means further includes means for applying a binary signal to an input of one of said first latches.

3. An arrangement as set forth in claim 2 wherein an output of the last latch of one of said sets of latches is connected to an input of the first latch of an adjacent set of latches.

4. An arrangement as set forth in claim 3 wherein said first clock pulses are applied to a first section of each latch of the selected set of latches and said second clock pulses are applied directly to a second section of each of said latches.

5. An arrangement as set forth in claim 4 wherein said first section is a master latch and said second section is slave latch.

6. An arrangement as set forth in claim 3 wherein said control means further includes comparator means for controlling the number of first clock pulses applied to said latches.

7. An arrangement as set forth in claim 1 wherein siad serially-arranged plurality of sets of latches includes first, second and third sets of latches, said second set of latches being interposed between said first and third sets of latches and each of said sets of latches being arranged as a shift register with an output of said first set of latches being connected to an input of said second set of latches and an output of said second set latches being connected to an input of said third set of latches.

8. An arrangement as set forth in claim 7 wherein said reset control means produces signals on said output lines for resetting only the latches of said first set of latches.

9. An arrangement as set forth in claim 7 wherein said reset control means produces signals on said output lines for resetting only the latches of said first and second sets of latches.

10. An arrangement as set forth in claim 7 wherein said reset control means produces signals on said output lines for resetting the latches on said first, second and third sets of latches.

11. An arrangement as set forth in claim 1 wherein said reset state is zero binary state.

12. An arrangement in a self-guarding data processing system for initialization and reset of said system, said system comprising a serially-arranged plurality of sets of latches, the latches of each of said sets being serially arranged, each of said sets of latches having an input and an output with at least an output of one of said sets of latches being connected to an input of another of said sets of latches and each of the latches of each of said plurality of sets of latches having a defined reset state, and control means including a plurality of parallelly-arranged logic gate means, each of said logic gate means having a plurality of inputs and an output, the output of each of said logic gate means being coupled to a respective one set of said plurality of sets of latches, clock means generating first and second clock pulses, said first clock pulses being applied selectively to said latches through the outputs of said plurality of parallelly-arranged logic gate means and said second clock pulses being applied to each set of said serially-arranged plurality of sets of latches, and reset control means having reset request input lines and output lines for generating control signals at said output lines, said control signals on the output lines of said reset control means being applied to the inputs of said plurality of parallelly-arranged logic gate means and said logic gate means being responsive to said control signals for selectively applying said first clock pulses to the latches of at least one of said sets of latches to set said at least one of said sets of latches in the reset state.

13. An arrangement as set forth in claim 12 wherein each of said sets of latches is arranged as a shift register and said control means further includes data means for applying a binary digit signal to an input of one of said shift registers, said clock means selectively propagating said binary digit signal through said shift registers.

14. An arrangement as set forth in claim 13 wherein said binary digit signal is a binary zero signal.

15. An arrangement as set forth in claim 13 wherein said shift registers are serially interconnected to form a continuous series of a given number of latches and counter means limiting the number of clock pulses applied to said latches to said given number.

* * * * *